(12) United States Patent
Beyer et al.

(10) Patent No.: US 8,232,188 B2
(45) Date of Patent: Jul. 31, 2012

(54) HIGH-K METAL GATE ELECTRODE STRUCTURES FORMED BY SEPARATE REMOVAL OF PLACEHOLDER MATERIALS USING A MASKING REGIME PRIOR TO GATE PATTERNING

(75) Inventors: Sven Beyer, Dresden (DE); Klaus Hempel, Dresden (DE); Thilo Scheiper, Dresden (DE); Stefanie Steiner, Hoyerswerda (DE)

(73) Assignee: GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 12/905,440

(22) Filed: Oct. 15, 2010

(65) Prior Publication Data
US 2011/0127613 A1 Jun. 2, 2011

(30) Foreign Application Priority Data
Nov. 30, 2009 (DE) .......................... 10 2009 047 306

(51) Int. Cl.
*H01L 27/092* (2006.01)
*H01L 21/336* (2006.01)
(52) U.S. Cl. ................ 438/585; 438/591; 257/E27.062; 257/E21.409
(58) Field of Classification Search .................. 438/585, 438/591
See application file for complete search history.

(56) References Cited

U.S. PATENT DOCUMENTS

| 6,171,910 B1 | 1/2001 | Hobbs et al. | 438/275 |
| 6,468,851 B1 | 10/2002 | Ang et al. | 438/216 |
| 2009/0087974 A1* | 4/2009 | Waite et al. | 438/592 |
| 2009/0236669 A1 | 9/2009 | Chen et al. | 257/380 |

FOREIGN PATENT DOCUMENTS

| DE | 102007046849 A1 | 4/2009 |
| EP | 1 959 491 A2 | 8/2008 |
| WO | WO 2009/122345 A1 | 10/2009 |

OTHER PUBLICATIONS

Translation of Official Communication from German Patent Office for German Patent Application No. 10 2009 047 306.8 dated Aug. 18, 2010.

* cited by examiner

*Primary Examiner* — Alexander Ghyka
(74) *Attorney, Agent, or Firm* — Williams, Morgan & Amerson, P.C.

(57) ABSTRACT

In a replacement gate approach in sophisticated semiconductor devices, the place-holder material of gate electrode structures of different type are separately removed. Furthermore, electrode metal may be selectively formed in the resulting gate opening, thereby providing superior process conditions in adjusting a respective work function of gate electrode structures of different type. In one illustrative embodiment, the separate forming of gate openings in gate electrode structures of different type may be based on a mask material that is provided in a gate layer stack.

9 Claims, 10 Drawing Sheets

HIGH-K METAL GATE ELECTRODE STRUCTURES FORMED BY SEPARATE REMOVAL OF PLACEHOLDER MATERIALS USING A MASKING REGIME PRIOR TO GATE PATTERNING

BACKGROUND OF THE INVENTION

1. Field of the Invention

Generally, the present disclosure relates to the fabrication of sophisticated integrated circuits including transistor elements comprising highly capacitive gate structures on the basis of a high-k dielectric material.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, CMOS technology is currently one of the most promising approaches due to the superior characteristics in view of operating speed and/or power consumption and/or cost efficiency. During the fabrication of complex integrated circuits using, for instance, CMOS technology, millions of transistors, i.e., N-channel transistors and P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity, is a dominant design criterion for accomplishing an increase in the operating speed of the integrated circuits.

Presently, the vast majority of integrated circuits are based on silicon due to substantially unlimited availability, the well-understood characteristics of silicon and related materials and processes and the experience gathered during the last 50 years. Therefore, silicon will likely remain the material of choice for future circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a base material of a gate insulation layer that separates the gate electrode, frequently comprised of polysilicon or metal-containing materials, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage and thus reduced threshold voltage may suffer from an exponential increase of the leakage current, while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 0.08 μm may require a gate dielectric made of silicon dioxide as thin as approximately 1.2 nm. Although, generally, usage of high speed transistor elements having an extremely short channel may be substantially restricted to high speed signal paths, whereas transistor elements with a longer channel may be used for less critical signal paths, such as storage transistor elements, the relatively high leakage current caused by direct tunneling of charge carriers through an ultra-thin silicon dioxide gate insulation layer may reach values for an oxide thickness in the range of 1-2 nm that may not be compatible with thermal design power requirements for performance driven circuits.

Therefore, replacing silicon dioxide-based dielectrics as the material for gate insulation layers has been considered, particularly for extremely thin silicon dioxide-based gate layers. Possible alternative materials include materials that exhibit a significantly higher permittivity so that a physically greater thickness of a correspondingly formed gate insulation layer provides a capacitive coupling that would be obtained by an extremely thin silicon dioxide layer.

Additionally, transistor performance may be increased by providing an appropriate conductive material for the gate electrode to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance based on the same thickness as a silicon dioxide-based layer, while additionally maintaining leakage currents at an acceptable level. On the other hand, the non-polysilicon material, such as titanium nitride and the like, in combination with other metals may be formed so as to connect to the high-k dielectric material, thereby substantially avoiding the presence of a depletion zone and providing superior conductivity compared to the doped polysilicon material. Since the threshold voltage of the transistors, which represents the voltage at which a conductive channel forms in the channel region, is significantly determined by the work function of the metal-containing gate material, an appropriate adjustment of the effective work function with respect to the conductivity type of the transistor under consideration has to be guaranteed.

Providing different metal species for adjusting the work function of the gate electrode structures for P-channel transistors and N-channel transistors at an early manufacturing stage may, however, be associated with a plurality of difficulties, which may stem from the fact that a complex patterning sequence may be required during the formation of the sophisticated high-k metal gate stack, which may result in a significant variability of the resulting work function and thus threshold voltage of the completed transistor structures. For instance, during a corresponding manufacturing sequence, the high-k material may be exposed to oxygen, which may result in an increase of layer thickness and thus a reduction of the capacitive coupling. Moreover, a shift of the work function may be observed when forming appropriate work function metals in an early manufacturing stage, which is believed to be caused by a moderately high oxygen affinity of the metal species, in particular during high temperature processes which may typically be required for completing the transistor structures, for instance for forming drain and source regions and the like.

For this reason, in some approaches, the initial gate electrode stack may be provided with a high degree of compatibility with conventional polysilicon-based process strategies and the actual electrode metal and the final adjustment of the work function of the transistors may be accomplished in a very advanced manufacturing stage, i.e., after completing the basic transistor structure. In a corresponding replacement gate approach, the high-k dielectric material may be formed and may be covered by an appropriate metal-containing material, such as titanium nitride and the like, followed by a standard polysilicon or amorphous silicon material, which may then be patterned on the basis of well-established advanced lithography and etch techniques. Consequently, during the process sequence for patterning the gate electrode structure, the sensitive high-k dielectric material may be protected by the metal-containing material, possibly in combination with sophisticated sidewall spacer structures, thereby substantially avoiding any undue material modification during the further processing. After patterning the gate electrode structure, conventional and well-established process techniques for forming the drain and source regions having the desired complex dopant profile are typically performed. After any high temperature processes, the further processing may be continued, for instance, by forming a metal silicide, if required, followed by the deposition of an interlayer dielectric material, such as silicon nitride in combination with silicon dioxide and the like. In this manufacturing stage, a top surface of the gate electrode structures embedded in the interlayer dielectric material may be exposed, for instance by etch techniques, chemical mechanical polishing (CMP) and the like. In many cases, the polysilicon material may be removed in both types of gate electrode structures in a common etch process and thereafter an appropriate masking regime may be applied in order to selectively fill in an appropriate metal, which may be accomplished by filling in the first metal species and selectively removing the metal species from one of the gate electrode structures. Thereafter, a further metal material may be deposited, thereby obtaining the desired work function for each type of transistor.

Although, in general, this approach may provide advantages in view of reducing process-related non-uniformities in the threshold voltages of the transistors since the high-k dielectric material may be reliably encapsulated during the entire process sequence without requiring an adjustment of the work function and thus the threshold voltage at an early manufacturing stage, the complex process sequence for removing the placeholder material and providing appropriate work function materials for the different types of transistors may also result in a significant degree of variability of the transistor characteristics, which may thus result in offsetting at least some of the advantages obtained by the common processing of the gate electrode structures until the basic transistor configuration is completed.

With reference to FIGS. 1*a*-1*b*, a typical conventional process strategy will be described in order to illustrate in more detail any problems related to the provision of work function materials for P-channel transistors and N-channel transistors on the basis of a replacement gate approach.

FIG. 1*a* schematically illustrates a cross-sectional view of a sophisticated semiconductor device 100 in an advanced manufacturing stage, i.e., in a manufacturing stage in which a first transistor 150A, such as a P-channel transistor, and a second transistor 150B, such as an N-channel transistor, are formed in and above active regions 103A, 103B. The active regions 103A, 103B are laterally delineated by isolation structures (not shown) within a semiconductor layer 103, such as a silicon-based semiconductor material. The semiconductor layer 103 is formed above a substrate 101, such as a silicon bulk substrate, a silicon-on-insulator (SOI) substrate and the like. In the case of an SOI substrate, a buried insulating material (not shown) may typically be provided between a crystalline substrate material and the semiconductor layer 103. In the manufacturing stage shown, the transistors 150A, 150B comprise gate electrode structures 160A, 160B, respectively. The gate electrode structures 160A, 160B, which may also be referred to as replacement gate electrode structures, comprise a gate dielectric material 163, which typically includes a high-k dielectric material, as previously discussed. Moreover, if required, an additional conventional dielectric material, such as a silicon oxide-based material, may be provided in the dielectric material 163, for instance in order to provide superior interface conditions with respect to a channel region 152 of the transistors 150A, 150B. Furthermore, a conductive cap material, such as a titanium nitride material 164, is typically formed on the dielectric material 163 in order to confine the sensitive high-k dielectric material. Furthermore, a placeholder material 161, such as a polycrystalline silicon material, is provided above the conductive cap layer 164 and has been removed during the previous processing so as to form gate openings 162, which in turn comprise a material layer 166A, as required for adjusting the characteristics of one of the gate electrode structures 160A, 160B. In the example shown in FIG. 1*a*, it is assumed that the material layer 166A comprises a metal species that is appropriate for adjusting the work function of the gate electrode structure 160A. As previously discussed, since the material 166A has to be removed from the opening 162 of the gate electrode structure 160B in a later manufacturing stage, frequently, a barrier material or etch stop material 167 is provided within the material layer 166A in order to enable the removal of the work function adjusting species from the opening 162 of the gate electrode structure 160B without unduly affecting the sensitive materials 164 and 163 in the gate electrode structure 160B. For example, tantalum nitride is frequently used for this purpose. The gate electrode structures 160A, 160B may further comprise a spacer structure 165 which has any appropriate configuration in terms of individual spacer elements, etch stop materials and the like, as is required for the processes for forming the transistors 150A, 150B. For example, the spacer structures 165 may comprise silicon nitride spacer elements, possibly in combination with silicon dioxide etch stop materials (not shown). Furthermore, the transistors 150A, 150B comprise drain and source regions 153 that laterally confine the channel region 152. It should be appreciated that the drain and source regions 153 in the transistor 150A may have a different configuration compared to the drain and source regions 153 of the transistor 150B due to the different conductivity type. Similarly, the channel regions 152 may differ in their basic conductivity type. Furthermore, it is to be noted that the drain and source regions 153 may have any appropriate vertical and lateral dopant profile, for instance including corresponding counter-doped areas or halo areas and the like, in order to adjust the overall transistor characteristics. In the example shown, metal silicide regions 154 may be provided in the drain and source regions 153 in order to reduce the overall series resistance and the contact resistivity of the devices 150A, 150B.

Additionally, the semiconductor device 100 comprises at least a portion of an inter-layer dielectric material 120 so as to laterally enclose the gate electrode structures 160A, 160B, wherein the dielectric material 120 may be comprised of a first dielectric material 121, such as a silicon nitride material, followed by a further dielectric material 122, such as silicon dioxide, as these two materials represent well-established dielectric materials for contact structures of sophisticated semiconductor devices.

The semiconductor device 100 as illustrated in FIG. 1a may be formed on the basis of the following processes. After forming the active regions 103A, 103B by providing isolation structures and performing appropriate implantation processes based on appropriate masking regimes, the gate electrode structures 160A, 160B may be formed. For this purpose, materials for the layers 163 and 164 may be formed, for instance, by appropriate deposition techniques and/or surface treatments, followed by the deposition of the material 161, which may also be referred to as a placeholder material for the gate electrode structures 160A, 160B. Moreover, any additional materials, such as dielectric cap layers, such as silicon nitride materials, hard mask materials, for instance in the form of silicon oxynitride, amorphous carbon and the like, may additionally be deposited in order to enhance the patterning of the gate electrode structures 160A, 160B. Thereafter, sophisticated lithography and etch techniques may be applied in order to pattern the resulting material layer stack, thereby obtaining the gate electrode structures 160A, 160B comprising the material layers 163, 164 and 161. Consequently, during this patterning process, the basic geometry of the gate electrode structures 160A, 160B are defined. For example, a gate length, which is to be understood as the horizontal extension of the layers 163 and 164 in FIG. 1a, may be adjusted to a value of 50 nm and less. Thereafter, the further processing is continued by forming the drain and source regions 153 in combination with the spacer structure 165, which may serve to confine the sensitive materials 163, 164 and provide a desired offset for implantation processes in order to define the lateral configuration of the drain and source regions 153. After any anneal processes for activating the dopants in the active regions 103A, 103B and for re-crystallizing implantation-induced damage, the metal silicide regions 154 may be formed by applying well-established silicidation techniques. Thereafter, the dielectric material 121 may be deposited, followed by the material 122, which may then be planarized in order to expose a surface of the poly-silicon material 161 in the gate electrode structures 160A, 160B. Next, a wet chemical etch process is applied, which removes the material 161 selectively with respect to the dielectric material 120, the spacer structure 165 and the conductive cap layer 164. For this purpose, TMAH (tetra methyl ammonium hydroxide) has been proven as a very efficient chemical agent which may be provided at elevated temperatures, thereby efficiently removing silicon material, while at the same time providing a high degree of selectively with respect to silicon dioxide, silicon nitride, titanium nitride and the like. Upon removing the placeholder material 161, the openings 162 are formed so as to receive the material layer 166A for adjusting the work function of the gate electrode structure 160A. For this purpose, the layer 166A is deposited by any appropriate deposition technique, such as sputter deposition, chemical vapor deposition (CVD) and the like, wherein the etch stop material 167 may be provided so as to enhance the further processing of the device 100. Consequently, a certain thickness of the material layer 166A may have to be provided within the openings 162, thereby resulting in a certain degree of overhangs 168 at the upper corners of the openings 162. Furthermore, the etch stop material 167 may have an influence on the finally obtained work function of the gate electrode structures 160A, 160B since the actual work function adjusting metal of the layer 166A may be offset from materials 164 and 163 by the layer 167. Consequently, a certain degree of threshold voltage shift may be induced in the transistors 150A and/or 150B during the further processing.

After the deposition of the material layer 166A, an etch mask 104 is provided so as to cover the gate electrode structure 160A and expose the gate electrode structure 160B in which the work function adjusting species of the layer 166A is to be removed selectively with respect to the etch stop layer 167. For this purpose, typically, a resist material is applied and lithographically patterned into the mask 104. During this sophisticated patterning process, the resist material may not completely fill the opening 162 and may thus result in a pronounced varying surface topography, as indicated by 104A, which may result in a less reliable patterning sequence upon exposing and developing the resist material. This deterioration mechanism may also strongly depend on the degree of overhangs 168, since, for a short gate length, the effect of the overhangs 168 may increasingly influence the fill behavior of the resist material during the lithography process. Consequently, a reliable fill and thus protection of the material layer 166A during a subsequent wet chemical etch process 105 may be less reliable in sophisticated device geometries. During the etch process 105, the work function adjusting metal, which may comprise aluminum, titanium nitride and the like for P-channel transistors, may be removed selectively with respect to the etch stop layer 167, for instance in the form of tantalum nitride, which may be accomplished by using sulfuric acid in combination with hydrogen peroxide and the like. In other cases, when the etch stop layer 167 is omitted, the ambient has a strong influence on the material characteristics of the underlying materials, thereby also affecting the resulting work function.

FIG. 1b schematically illustrates the semiconductor device 100 when exposed to a further reactive process ambient 106, in which the etch mask 104 (FIG. 1a) is removed. For example, the process 106 may represent a plasma assisted process or a wet chemical etch process. Due to the sophisticated geometry of the openings 162, in particular in the gate electrode structure 160A which may still have the overhangs 168, it may become increasingly difficult to completely remove the resist material, which may thus result in resist residues 104R. Consequently, upon further processing the device 100, the residues 104R, possibly in combination with any process non-uniformities caused during the etch process 105 (FIG. 1a), may result in a pronounced degree of variability of transistor characteristics of the transistor 150A and/or the transistor 150B. That is, process non-uniformities, in particular in the gate electrode structure 160A, may influence the further processing, i.e., the deposition of a further material layer including a work function metal for the transistor 150B and the deposition of an electrode metal, such as aluminum, thereby resulting in a significant yield loss in highly scaled semiconductor devices.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to semiconductor devices and methods for forming the same in which gate electrode structures may be formed on the basis of a high-k dielectric material that is provided in an early manufacturing stage, while the work function for P-channel transistors and N-channel transistors may be adjusted in a late manufacturing stage on the basis of a replacement gate approach. To this end, the placeholder material may be replaced separately for these transistors, thereby avoiding many of the problems associated with the patterning of work function metals in sophisticated gate openings, as is discussed earlier. Moreover, in some illustrative aspects disclosed herein, the separate removal of the placeholder materials of different transistors may be accomplished on the basis of an appropriately configured gate layer stack that is provided in an early manufacturing stage so as to reduce or even completely avoid any additional lithography processes in an advanced manufacturing stage. In some illustrative embodiments, a mask layer may be provided so as to selectively cover the placeholder material for one type of transistor, thereby enabling a reliable removal of the placeholder material of the other transistor type. In other illustrative embodiments, a specific difference in topography, i.e., gate height, may be introduced, which may then be taken advantage of so as to use a portion of an interlayer dielectric material as an efficient etch stop material during a patterning regime for separately removing the place-holder material. Furthermore, in some illustrative embodiments, the corresponding gate openings may be separately filled with an electrode material, which may include the appropriate work function adjusting species, thereby reliably confining any sensitive materials, such as high-k dielectric materials and the like, upon the further processing, i.e., forming the other gate opening and filling the same with an appropriate electrode material.

One illustrative method disclosed herein comprises removing a placeholder material from a first gate electrode structure of a first transistor so as to form a first gate opening while masking the placeholder material in a second gate electrode structure of a second transistor. The first gate opening is then filled with a first electrode material. The method further comprises removing the placeholder material of the second gate electrode structure in the presence of the first electrode material so as to form a second gate opening. Additionally, the method comprises filling the second gate opening with a second electrode material.

A further illustrative method disclosed herein relates to forming gate electrode structures. The method comprises filling a first gate opening of a first gate electrode structure with a first electrode material that comprises a first work function adjusting species. The method additionally comprises forming a second gate opening in a second gate electrode structure after filling the first gate opening. Furthermore, the method comprises filling the second gate opening with a second electrode material that comprises a second work function adjusting species that differs from the first work function adjusting species.

One illustrative semiconductor device disclosed herein comprises an N-channel transistor comprising a first gate electrode structure. The first gate electrode structure comprises a first gate insulation layer including a high-k dielectric material, a metal-containing cap material formed above the high-k dielectric material and a first electrode metal formed on the metal-containing cap material, wherein the first electrode metal comprises a first work function adjusting species. The semiconductor device further comprises a P-channel transistor comprising a second gate electrode structure. The second gate electrode structure in turn comprises a second gate insulation layer including the high-k dielectric material, the metal-containing cap material and a second electrode metal formed on the metal-containing cap material. Moreover, the second electrode metal comprises a second work function adjusting species. Additionally, the first electrode metal lacks the second work function adjusting species, while the second electrode metal lacks the first work function adjusting species.

BRIEF DESCRIPTION OF THE DRAWINGS

The disclosure may be understood by reference to the following description taken in conjunction with the accompanying drawings, in which like reference numerals identify like elements, and in which.

Figure 1A:
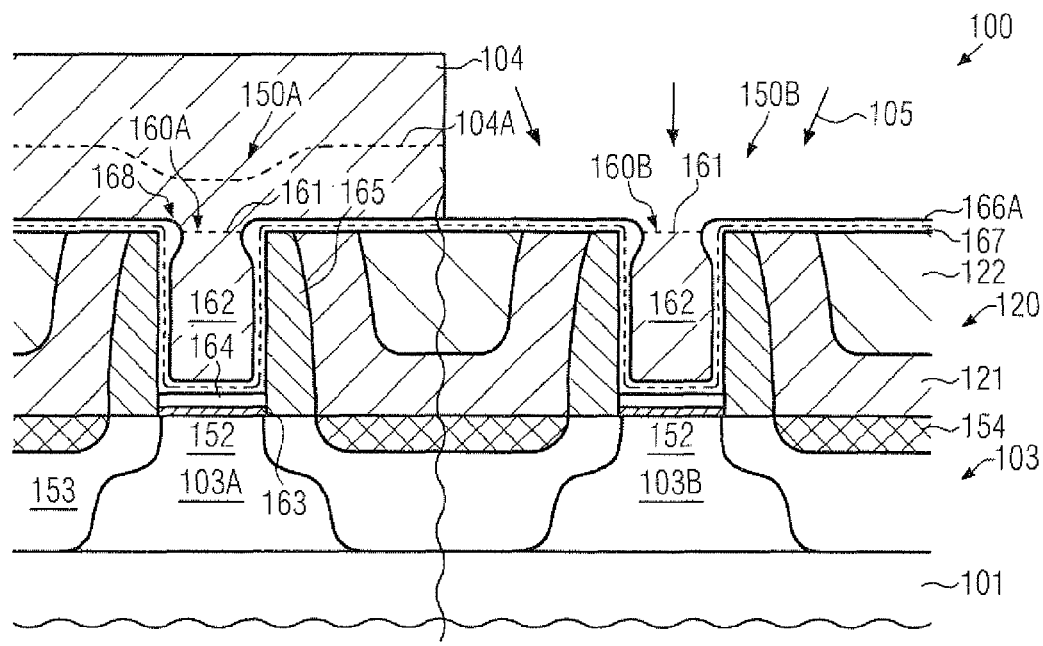
FIGS. 1a-1b schematically illustrate cross-sectional views of a semiconductor device in which two different work function adjusting metals are applied in a late manufacturing stage according to a conventional replacement gate approach, which may result in pronounced transistor non-uniformities.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides semiconductor devices and manufacturing techniques in which the placeholder material, such as polysilicon, may be removed separately for N-channel transistors and P-channel transistors or any other types of different field effect transistors that may require a different adjustment of a work function in the gate electrode structure in a late manufacturing stage. To this end, in some illustrative embodiments, an appropriate mask material, such as an oxide material and the like, may be provided in a gate layer stack prior to actually patterning the gate electrode structures, wherein the mask material may be used as an efficient etch stop material upon removing the placeholder material of a gate electrode structure that does not include the mask material. For this purpose, an appropriate material, such as silicon dioxide, may be formed with a desired thickness that may provide sufficient etch stop capabilities without unduly affecting the further processing. Consequently, in a very advanced manufacturing stage in the gate electrode structure lacking the mask material, the placeholder material may be readily exposed and removed, while integrity of the placeholder material in the masked gate electrode structure may be preserved. Consequently, an appropriate electrode metal, which may comprise a dedicated work function adjusting species, may be filled into the resulting gate opening, thereby also reliably confining any sensitive materials, such as the high-k dielectric material and a corresponding conductive cap material, if provided. Thereafter, the processing may be continued by exposing the masked placeholder material, which may be accomplished, in some illustrative embodiments, during a process sequence for removing any excess material of the previously deposited electrode metal, thereby avoiding any additional lithography processes. Thereafter, the placeholder material may be efficiently removed while the electrode metal in the other gate electrode structure may be used as an etch stop material. Finally, the resulting gate opening may be filled with an appropriate electrode metal in accordance with requirements for the transistor under consideration. Consequently, in this manner, sophisticated lithography processes and associated resist patterning and strip processes in the presence of sophisticated gate openings may be efficiently avoided. Furthermore, complex patterning processes in sophisticated gate openings, for instance based on sputter etch techniques and the like, may also be avoided, which may conventionally result in significant modifications of sensitive materials, thereby causing a shift of the work function, deteriorating charge carrier mobility and the like.

In some illustrative embodiments, the effect of a selectively provided mask material in the gate layer stack may be combined with a difference in height or topography of the gate electrode structures, which may be introduced upon incorporating a strain-inducing semiconductor alloy in one of the transistors. That is, due to the height difference, which may, in many conventional approaches, be considered as an undesired effect of the manufacturing process, may result in superior integrity of the mask material upon exposing the placeholder material in the gate electrode structure that does not include the mask material. Consequently, any etch-related non-uniformities during the further processing may be reduced, thereby even further enhancing the overall uniformity of transistor characteristics.

In other illustrative embodiments disclosed herein, a difference in gate height may be intentionally introduced in an early manufacturing stage when a dedicated mask material may be considered inappropriate.

Figure 1B:
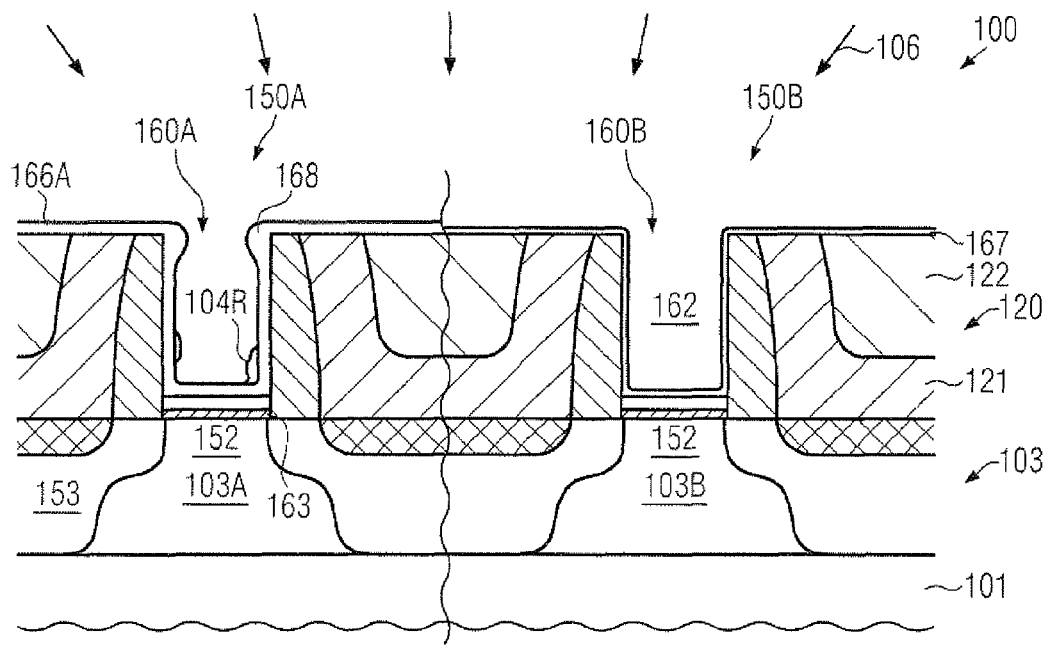
Figure 2A:
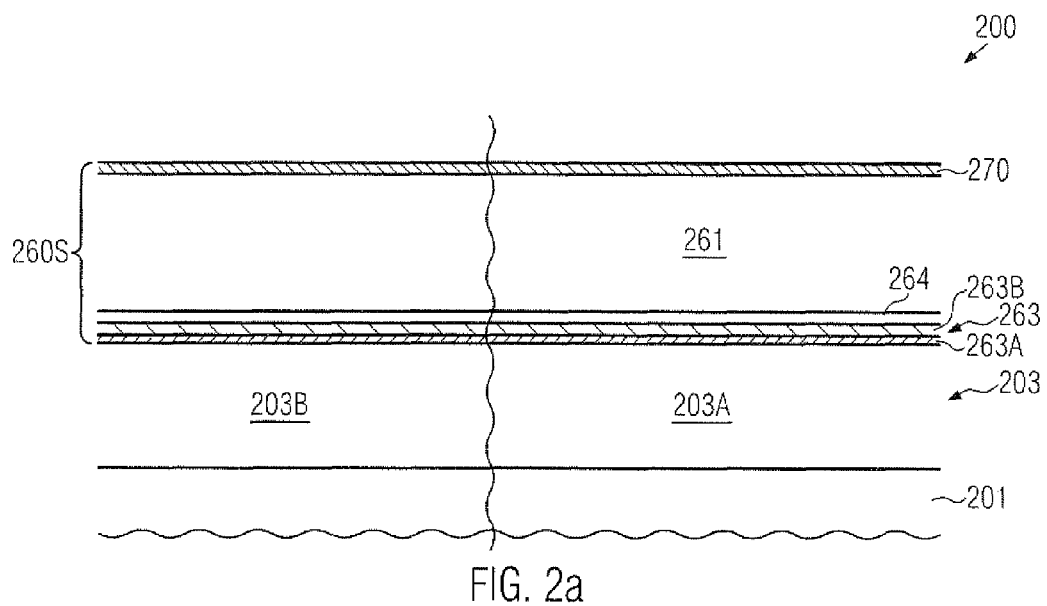
FIGS. 2a-2n schematically illustrate cross-sectional views of a semiconductor device during various manufacturing stages in forming gate electrode structures on the basis of a replacement gate approach by separately forming gate openings of N-channel transistors and P-channel transistors, respectively, according to illustrative embodiments.
Figure 2B:
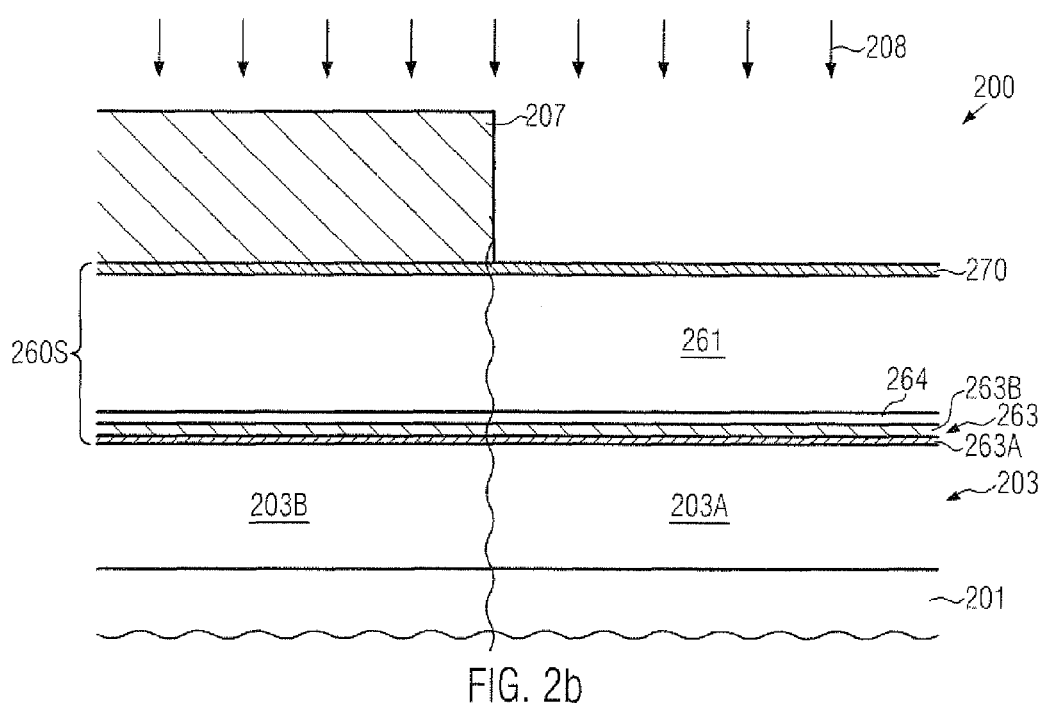
FIGS. 2o-2r schematically illustrate cross-sectional views of the semiconductor device during various manufacturing stages in which an alternative masking regime may be used on the basis of different gate topography, according to still further illustrative embodiments.
Figure 2C:
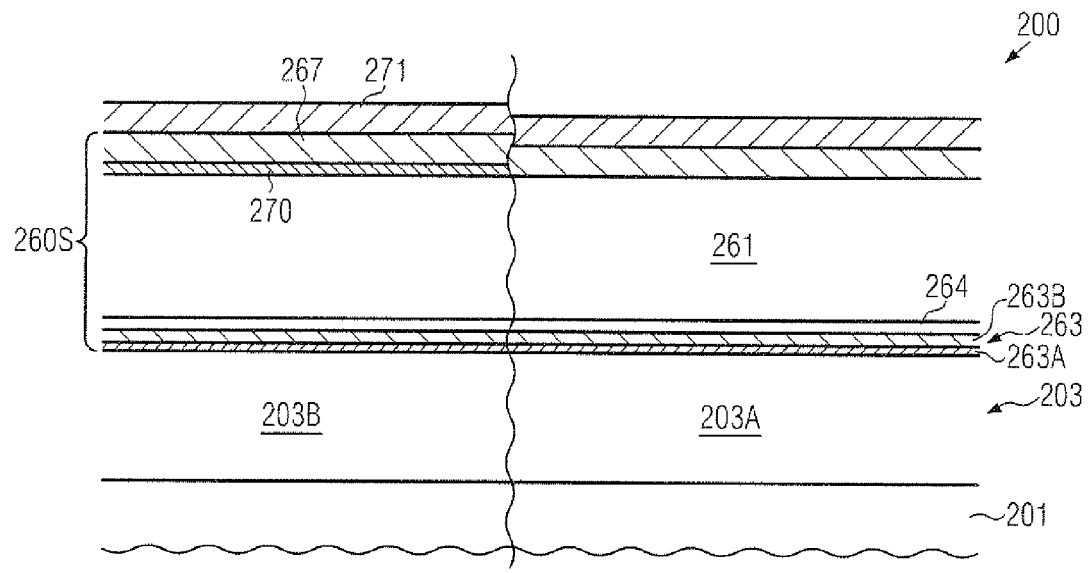
Figure 2D:
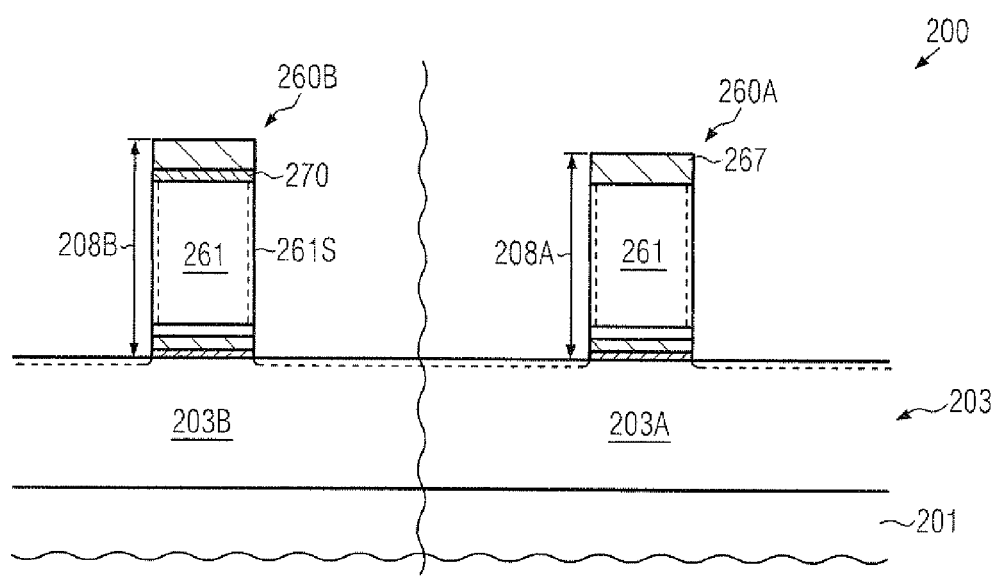
Figure 2E:
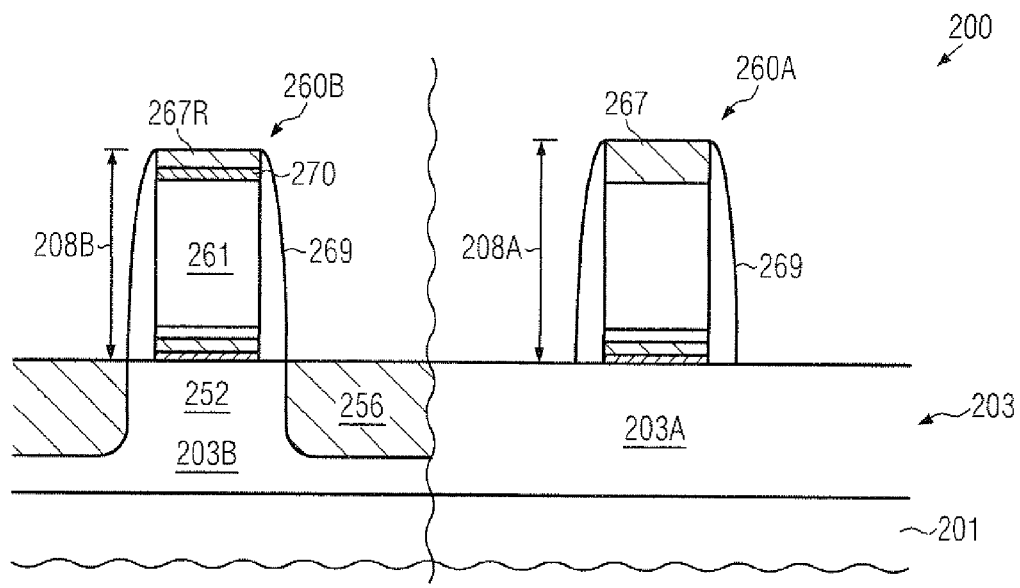
Figure 2F:
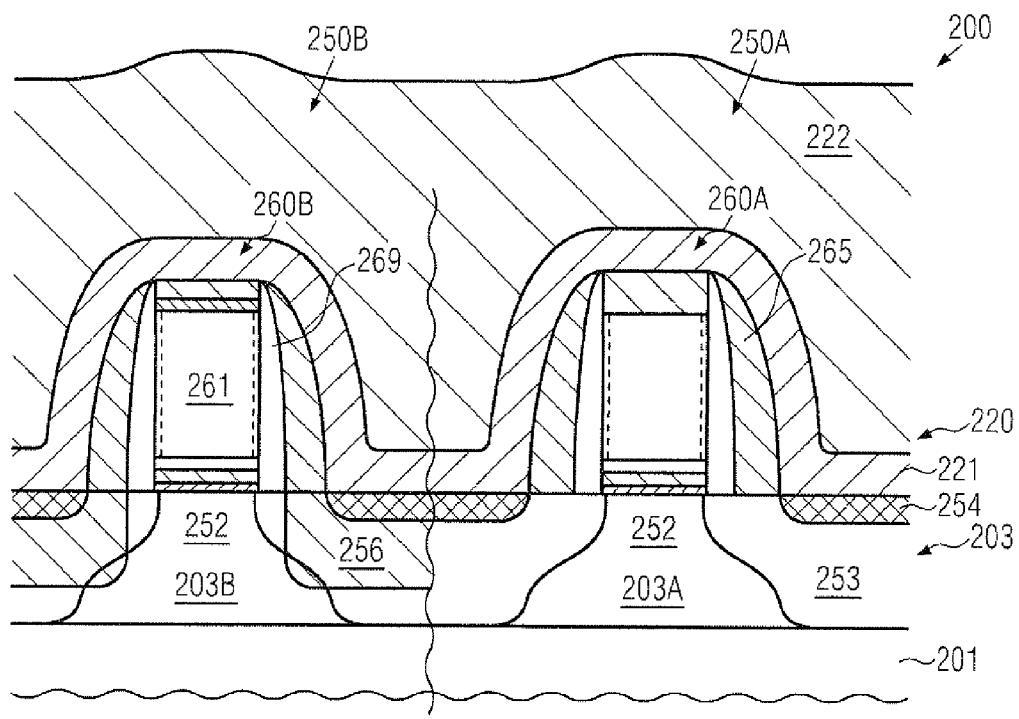
Figure 2G:
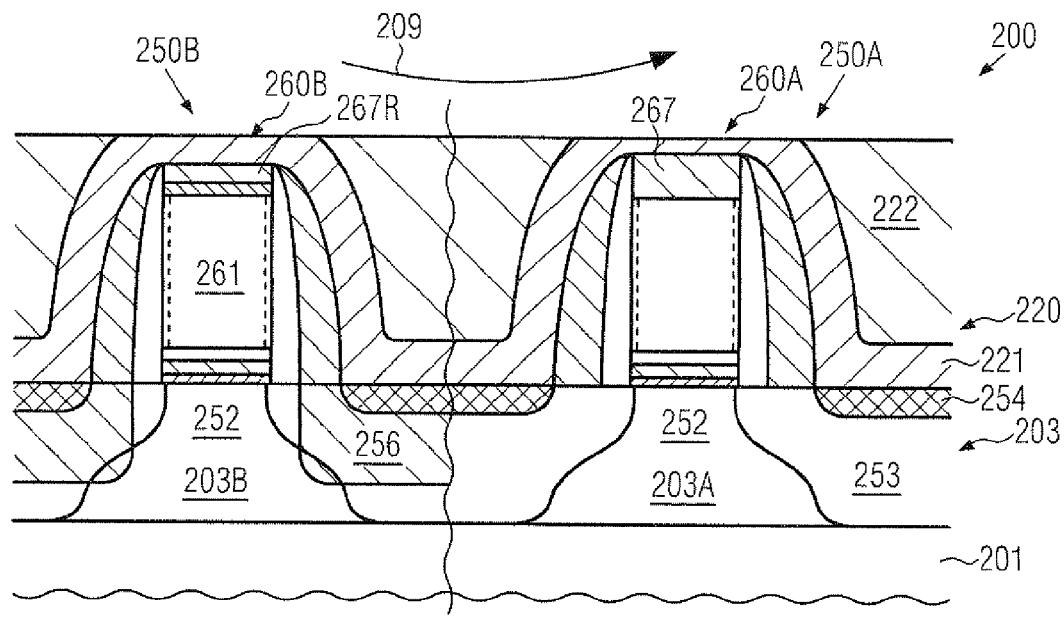
Figure 2H:
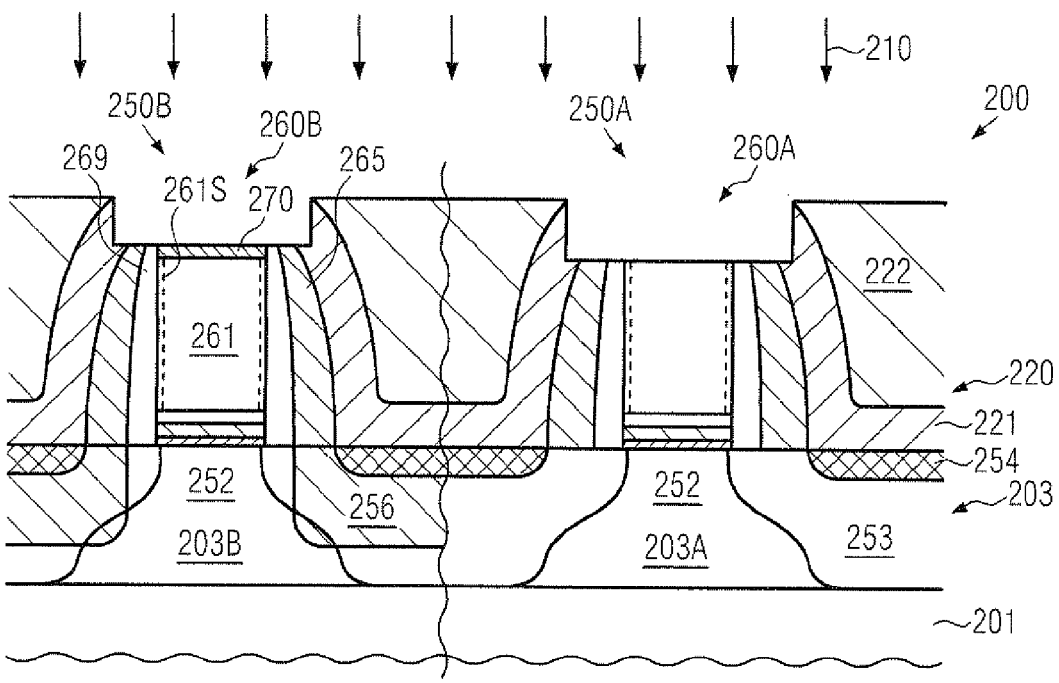
Figure 2I:
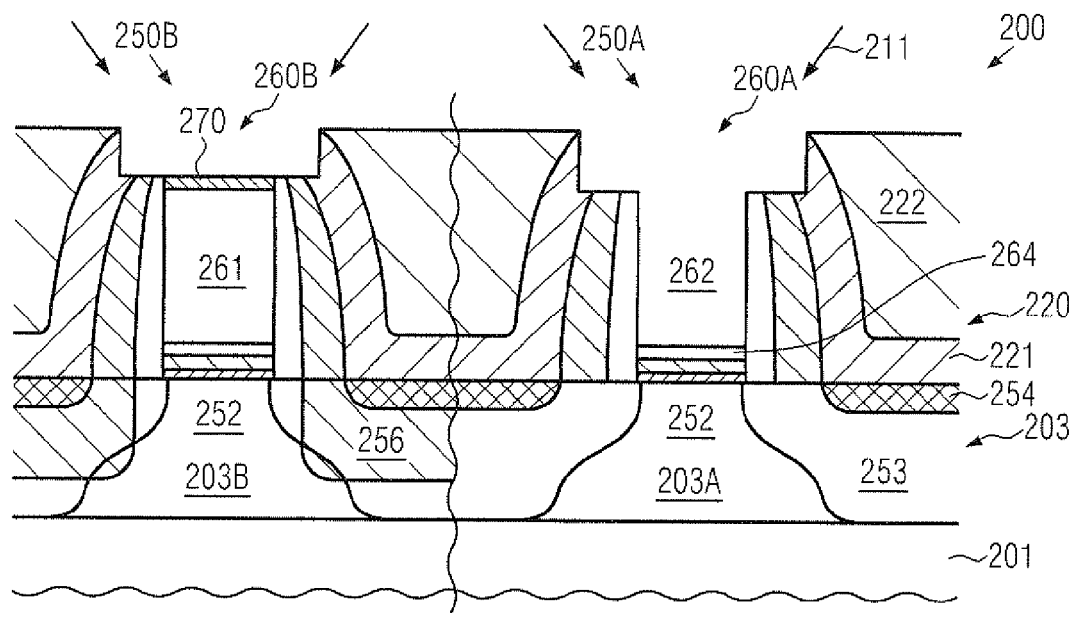
Figure 2J:
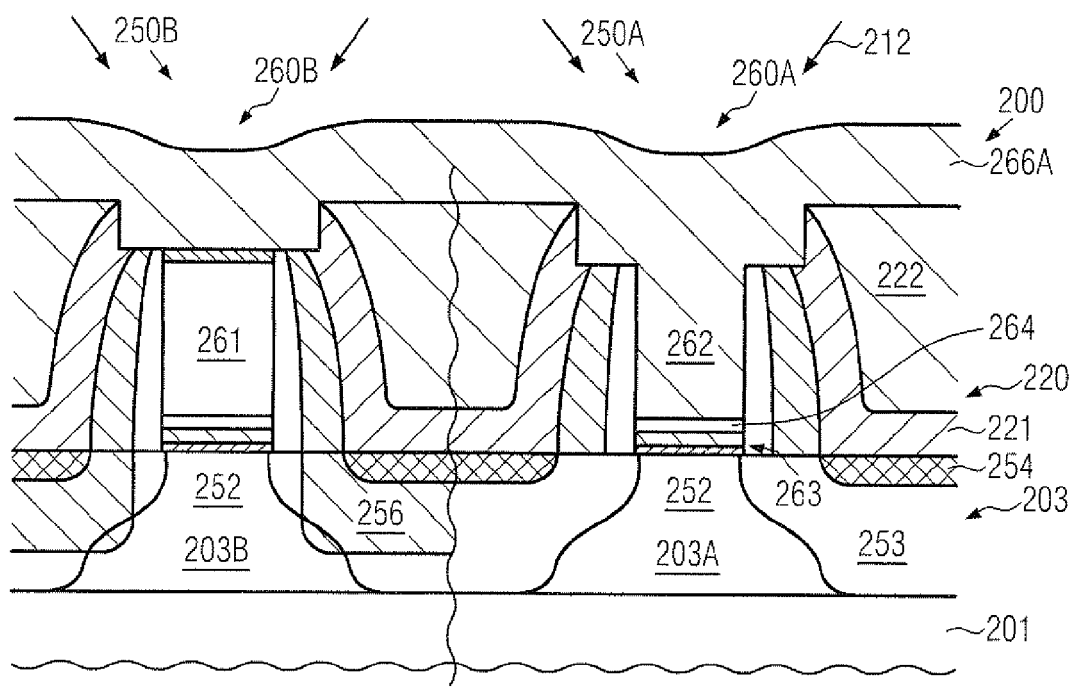
Figure 2K:
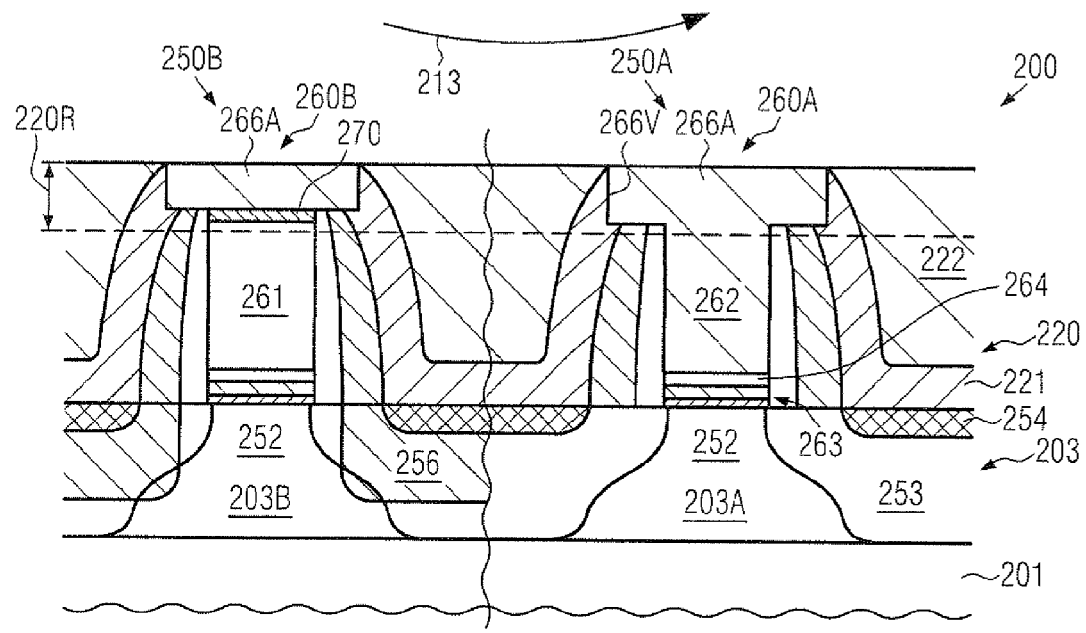
Figure 2L:
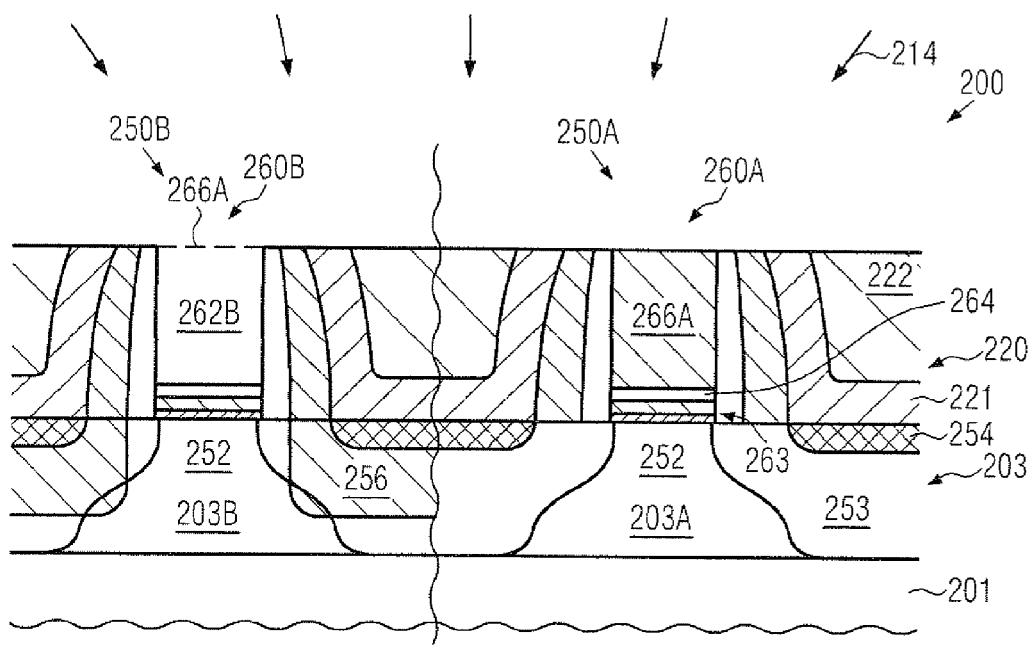
Figure 2M:
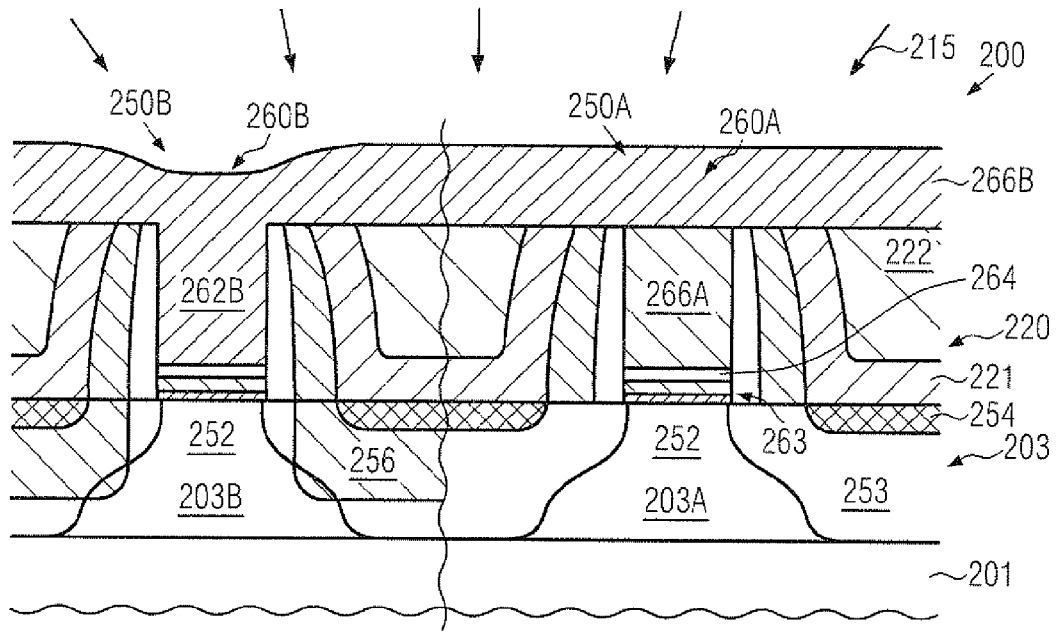
Figure 2N:
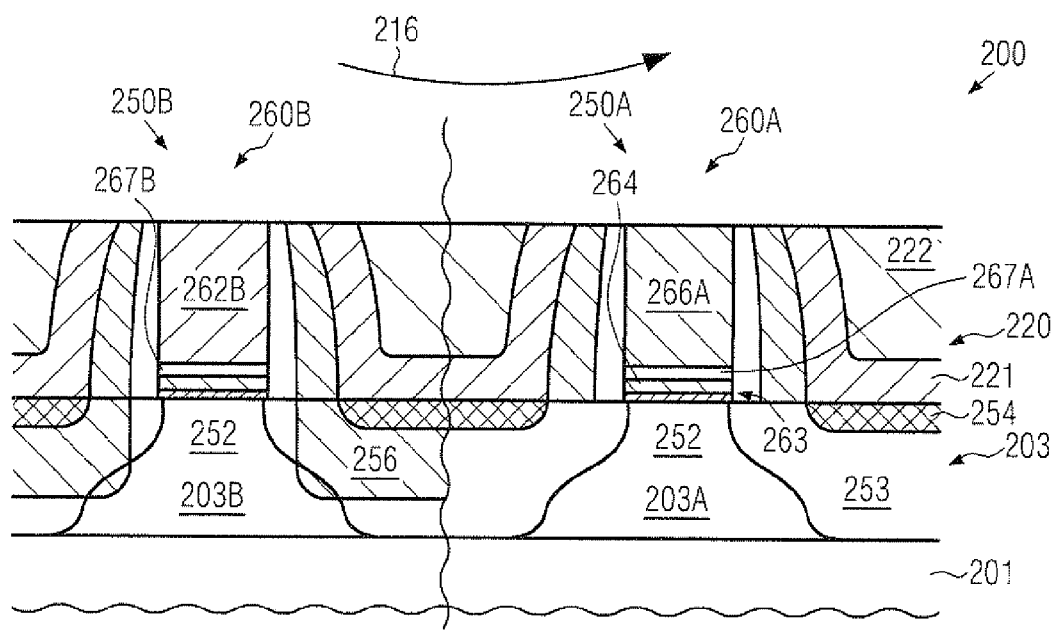
Figure 2O:
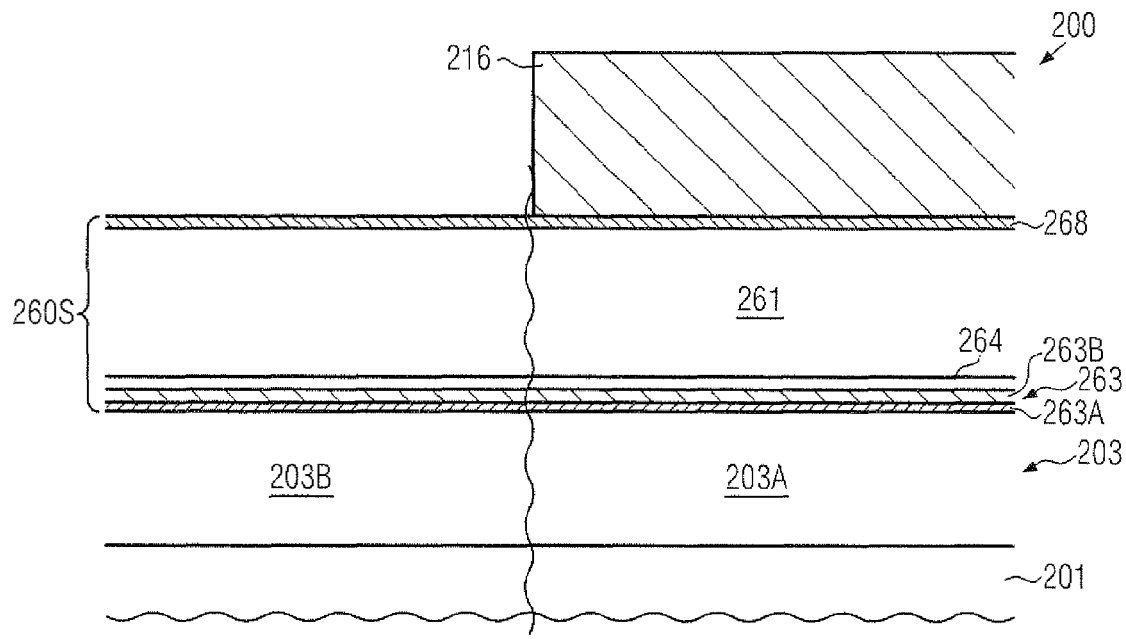
Figure 2P:
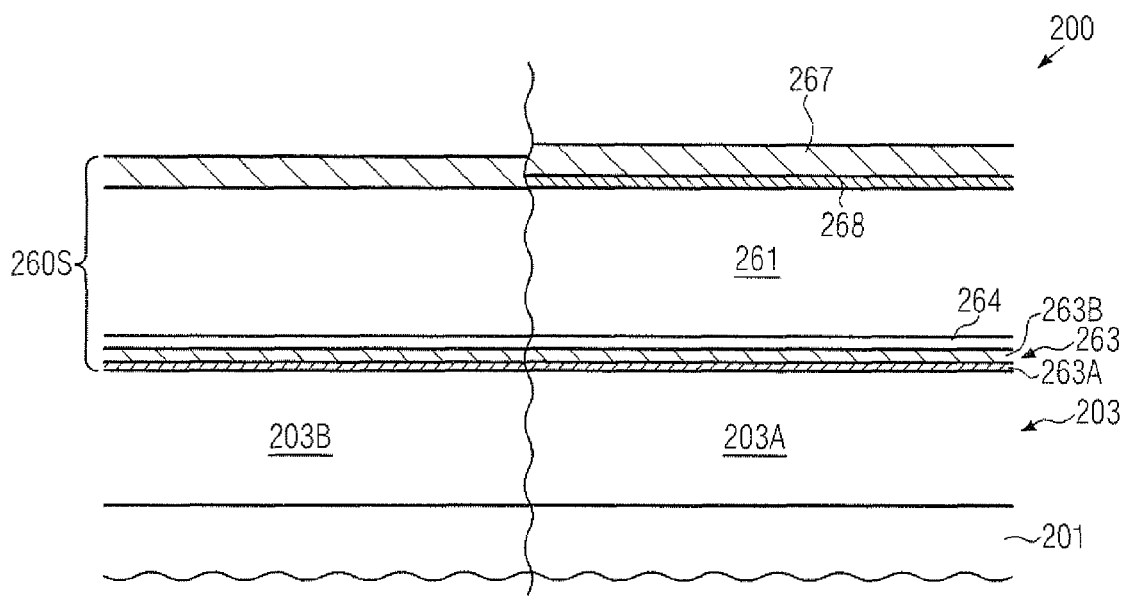
Figure 2Q:
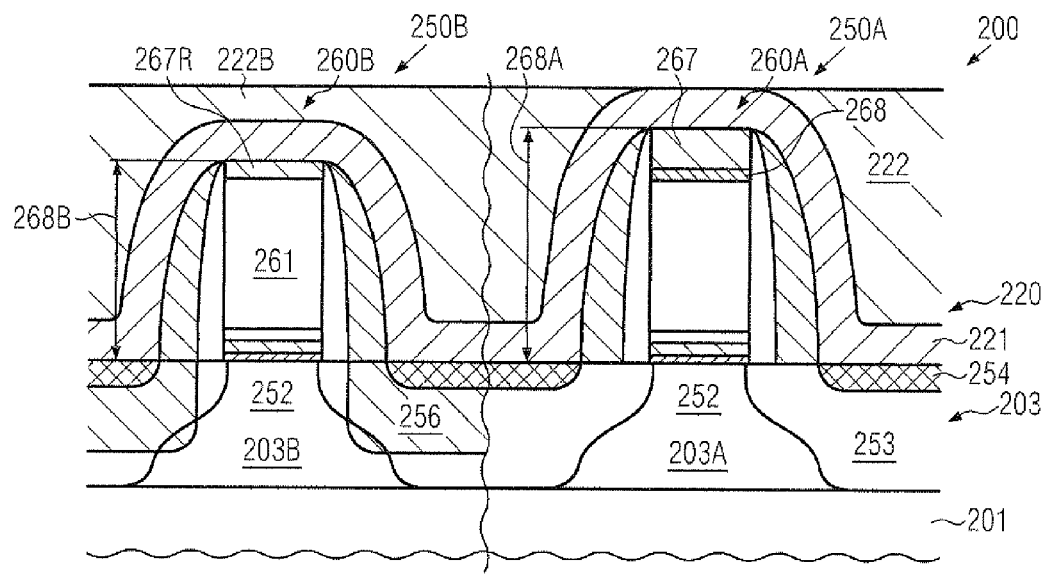
Figure 2R:
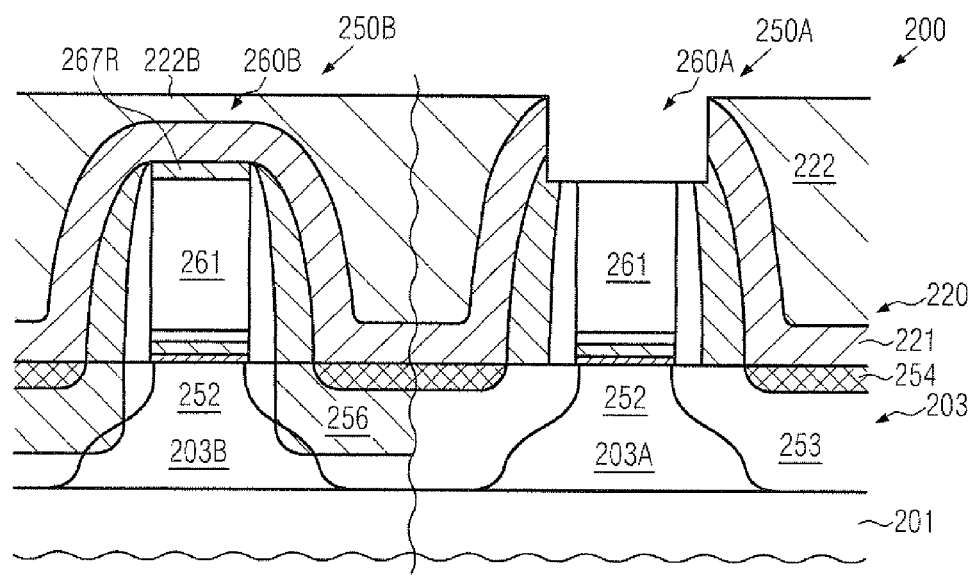

With reference to FIGS. 2a-2r, further illustrative embodiments will now be described in more detail, wherein reference may also be made to FIGS. 1a-1b, if appropriate.

FIG. 2a schematically illustrates a cross-sectional view of a semiconductor device 200 comprising a substrate 201 in combination with a semiconductor layer 203, in which a first active region 203A and a second active region 203B may be provided, for instance, on the basis of isolation structures (not shown) and the like. The semiconductor layer 203 may represent any silicon-based material, possibly in combination with a buried insulating material (not shown) which may be formed between the substrate 201 and the layer 203 when an SOI configuration is considered. In other cases, the layer 203 in combination with the substrate 201 may represent a bulk configuration. Moreover, in the manufacturing stage shown, a gate layer stack 260S may be formed on the active regions 203A, 203B and may comprise a gate dielectric layer 263 in combination with a cap layer 264. Furthermore, the stack 260S may comprise a placeholder material 261, such as a silicon material and the like, followed by a mask layer 270. The mask layer 270 may be comprised of any appropriate material which may provide etch stop capabilities in a very late manufacturing stage when the placeholder material 261 is to be removed from corresponding gate electrode structures still to be formed. In some illustrative embodiments, the mask layer 270 may be comprised of silicon dioxide having a thickness of 10 nm and less. By selecting a thickness in the above-identified range for the mask layer 270, a difference in gate height caused by the patterning of the mask layer 270 may not unduly affect the patterning of the gate layer stack 260S. It should be appreciated that, in other illustrative embodiments, the mask layer 270 may be provided in the form of other materials, which may enable an efficient patterning of the layer stack 260S and provide appropriate etch stop capabilities. For example, many high-k dielectric materials may provide superior etch resistivity at a reduced thickness and may thus be used as the mask layer 270.

It should be appreciated that the gate layer stack 260S may have any appropriate configuration in order to comply with the requirements of sophisticated gate electrode structures, as is also previously discussed with reference to the semiconductor device 100. For example, the gate dielectric material 263 may comprise a high-k dielectric material 263B, such as hafnium oxide, zirconium oxide and the like, while, in the embodiment shown, additionally, a "conventional" dielectric material 263A may be provided, for instance in the form of a silicon oxynitride material and the like. Furthermore, in order to preserve integrity of the dielectric material 263, the cap layer 264 may be provided, for instance in the form of a metal-containing material, such as titanium nitride, which may also include additional species so as to obtain the desired material characteristics. Moreover, the material 261 may be provided as an amorphous silicon material or a polycrystalline silicon material, while in other cases any other appropriate semiconductor materials may be used, if the material 261 is to be used as an electrode material in other device areas.

The semiconductor device 200 as shown in FIG. 2a may be formed on the basis of any appropriate process technique. For example, the active regions 203A, 203B may be formed on the basis of process techniques as previously described, followed by deposition processes, possibly in combination with surface treatments, in order to form the materials 263 and 264. Thereafter, the placeholder material 261 may be deposited, and thereafter the mask layer 270 may be formed by deposition, oxidation and the like.

FIG. 2b schematically illustrates the semiconductor device 200 with an etch mask 207, such as a resist mask, formed above the gate layer stack 260S so as to expose the mask layer 270 above the active region 203A. Moreover, the device 200 is exposed to a reactive etch ambient 208 in order to selectively remove the exposed portion of the mask layer 270. For this purpose, any appropriate plasma-based etch recipe, wet chemical etch recipe and the like may be applied, wherein, preferably, a moderately high etch selectivity with respect to the material 261 may suppress undue material erosion of the material 261. For example, silicon oxide-based materials may be efficiently removed on the basis of hydrofluoric acid (HF) and the like. Due to the reduced thickness of the mask layer 270, undue material loss of the material 261 may be substantially avoided, even if a less pronounced degree of selectivity may be obtained when performing the etch process 208.

FIG. 2c schematically illustrates the semiconductor device 200 in a further advanced manufacturing stage in which a dielectric cap material 267, for instance in the form of a silicon nitride material and the like, may be provided as a final material layer of the gate layer stack 260S. Thus, due to the preceding patterning of the mask layer 270, the gate layer stack 260S may comprise the layer 270 above the active region 203B, thereby producing a slight difference in height of the stack 260S above the active regions 203B, 203A. Moreover, a hard mask material 271 may be formed above the gate layer stack 260S and may comprise any appropriate material, such as silicon dioxide, amorphous carbon material and the like, possibly in combination with additional anti-reflective coating (ARC) materials, depending on the following patterning strategy.

The material layers 267 and 271 may be formed in accordance with any appropriate deposition technique, such as thermally activated CVD, plasma enhanced CVD and the like. Thereafter, sophisticated lithography techniques may be applied in order to form a resist mask (not shown) which may be used for patterning the hard mask material 271. Thereafter, the gate layer stack 260S may be patterned on the basis of sophisticated anisotropic etch techniques, for which a plurality of well-established etch recipes are available. It should be appreciated that the presence of the mask layer 270 may readily be taken into consideration by introducing a short etch step for etching through the material 270 upon opening the cap material 267.

FIG. 2d schematically illustrates the semiconductor device 200 with a first gate electrode structure 260A formed above the active region 203A and with a second gate electrode structure 260B formed above the active region 203B. It should be appreciated that, due to the presence of the mask layer 270 in the gate electrode structure 260B, a gate height 208B thereof may be greater than a gate height 208A of the gate electrode structure 260A, wherein a difference in the height may substantially correspond to the thickness of the layer 270. Moreover, in this manufacturing stage, a protective material 261S, for instance in the form of an oxide material, may be formed on exposed sidewalls of the placeholder material 261, which may be accomplished on the basis of any appropriate oxidation process. In this case, an oxide material may also be formed at a surface of the active regions 203A, 203B.

FIG. 2e schematically illustrates the semiconductor device 200 in a further advanced manufacturing stage according to some illustrative embodiments in which a strain-inducing semiconductor alloy is to be formed in one of the active regions 203A, 203B. For instance, as shown in FIG. 2e, a strain-inducing semiconductor alloy 256 may be formed in the active region 203B in order to create a desired strain component in an adjacent channel region 252. For instance, the semiconductor alloy 256, which is to be understood as a crystalline semiconductor mixture, may comprise silicon and germanium, thereby inducing a compressive strain component in the channel region 252, which may be advantageous for forming P-channel transistors. As is well known, the charge carrier mobility in the channel region of a field effect transistor may be modified by introducing a certain type and magnitude of strain, thereby also achieving a superior overall transistor performance when adjusting appropriate strain conditions. To this end, a spacer material, such as a silicon nitride material, may be deposited above the gate electrode structures 260A, 260B as shown in FIG. 2d, and thereafter spacer elements 269 may be formed on the basis of anisotropic etch techniques on the gate electrode structure 260B, while integrity of the spacer material above the active region 203A may be preserved by a corresponding etch mask (not shown). Thereafter, appropriate cavities may be formed in the active region 203B and these cavities may be refilled with the material 256 on the basis of selective epitaxial growth techniques, wherein the placeholder material 261 may be protected by the cap material 267 and the spacer 269, while the gate electrode structure 260A may still be covered by the corresponding spacer layer. Thereafter, the spacers 269 may also be formed on the gate electrode structure 260A, while masking the gate electrode structure 260B. It should be appreciated that, during the process sequence for forming the cavities in the active region 203B, performing the selective epitaxial growth process and the like, a certain degree of material erosion of a cap material 267 may occur, thereby resulting in a reduced thickness 267R so that the gate height 208B may be less than the gate height 208A, since the cap material 267 may have experienced a significantly lesser degree of material erosion compared to the material 267R.

It should be appreciated that, in other illustrative embodiments, the strain-inducing semiconductor alloy 256 may not be provided if the resulting transistor performance is compatible with a configuration without using a strain-inducing mechanism on the basis of an embedded strain-inducing semiconductor material.

FIG. 2f schematically illustrates the semiconductor device 200 in a further advanced manufacturing stage. As illustrated, a first transistor 250A may be formed in and above the active region 203A and may comprise the gate electrode structure 260A, which may additionally comprise a sidewall spacer structure 265. Similarly, a second transistor 250B may be formed in and above the active region 203B and may comprise the gate electrode structure 260B. For example, in one illustrative embodiment, the transistor 250B may represent a P-channel transistor, while the transistor 250A may represent an N-channel transistor. In this case, performance of the transistor 250B may be enhanced by providing the strain-inducing semiconductor material 256, if required, as a compressive strain-inducing material on the basis of silicon, in combination with another species, such as germanium, tin and the like. Furthermore, the transistors 250A, 250B may comprise drain and source regions 253, which may have any appropriate configuration in accordance with the requirements of the associated transistor elements. Furthermore, metal silicide regions 254 may be provided in the drain and source regions 253. Additionally, the semiconductor device 200 may comprise an interlayer dielectric material 220, which may enclose the gate electrode structures 260A, 260B and which may comprise a first sub-layer 222, for instance in the form of a silicon oxide material, in combination with a second sub-layer 221, such as a silicon nitride material and the like.

The semiconductor device 200 as illustrated in FIG. 2f may be formed on the basis of any appropriate process strategy, as is, for instance, also described with reference to the semiconductor device 100. That is, the drain and source regions 253 may be formed on the basis of ion implantation techniques using the spacer structures 269 and 265 in combination with the remaining portions of the gate electrode structures 260A, 260B as an implantation mask. After annealing the device 200, in order to activate the dopants and re-crystallize implantation-induced damage, the metal silicide regions 254 may be formed by applying any appropriate silicidation regime. Next, the layer 221 may be formed on the basis of plasma enhanced CVD techniques, wherein, if desired, a specific internal stress level may be adjusted in the material 221 in order to further enhance performance of one or both of the transistors 250A, 250B. Subsequently, the layer 222 may be deposited, for instance, by plasma enhanced CVD techniques, thermally activated CVD techniques and the like.

FIG. 2g schematically illustrates the semiconductor device 200 in a manufacturing stage in which a material removal process 209, for instance on the basis of a CMP technique, may be performed to planarize the material 222 and expose a portion of the material 221 at least above the gate electrode structure 260A. For this purpose, well-established CMP recipes may be applied in which the process parameters and the slurry material may be selected so as to preferably remove the material 222, such as a silicon dioxide material, while the material 221 may act as an efficient stop material. In the embodiment shown in FIG. 2g, a certain degree of over-polish may be applied, thereby also exposing the material 221 above the gate electrode structure 260B. In other cases, a portion of the material 221 may be preserved above the gate electrode structure 260B due to the difference in height, as will be described later on in more detail.

FIG. 2h schematically illustrates the device 200 when exposed to an etch ambient 210 that is configured to remove the materials 221 and 267 (FIG. 2g) in order to expose the placeholder material 261 of the gate electrode structure 260A, while the material 261 of the gate electrode structure 260B may be protected at least by the mask layer 270. For example, well-established etch recipes for removing silicon nitride material selectively with respect to silicon dioxide and silicon material are available and may be used during the etch process 210. For instance, a wet chemical etch process based on hot phosphoric acid may be applied, while, in other cases, a selective plasma assisted etch recipe may be used, wherein a corresponding lateral etch rate may be significantly less compared to wet chemical etch processes. For instance, a selective removal of silicon nitride material with respect to silicon dioxide and silicon may frequently be applied during the formation of silicon nitride spacer elements and may also be applied during the process 210. Consequently, the placeholder material 261 may be reliably exposed in the gate electrode structure 260A, while at least the mask material 270 may avoid a significant etching of the material 261 in the gate electrode structure 260B. It should be appreciated that, if a portion of the material 222 is preserved above the gate electrode structure 260B and the material 267R and the layer 221, as discussed above with reference to FIG. 2g, the mask layer 270 may still remain covered by silicon nitride material, as will also be discussed later on in more detail. Moreover, it should be appreciated that, if superior integrity of the material 261 is to be obtained, the protective sidewall material 261S, for instance in the form of oxide, as previously discussed, may be provided with a thickness of more than one nanometer, while also a certain degree of corner rounding may be accomplished, for instance by applying a plasma treatment upon providing the protective material 261S (FIG. 2d). In this case, integrity of the material 261 may be preserved even if a certain degree of etching the spacers 269 and 265 may occur during the etch process 210.

In some illustrative embodiments, an additional cleaning process may be performed after exposure of the material 261 so as to remove any material residues, such as oxides, contaminants and the like, which may be accomplished on the basis of hydrofluoric acid. Also in this case, an increased thickness of the protective material 261S may be advantageous in preserving the integrity of the material 261 in case of a certain degree of "under etching" of the spacers 269, 265. Moreover, a corresponding clean process may be performed so as to maintain a certain thickness of the mask material 270 so as to still maintain the desired etch stop capability during the further processing when removing the placeholder material 261 selectively in the gate electrode structure 260A. In other cases, the mask material 270 may still be covered by a certain amount of silicon nitride material, thereby providing superior integrity of the mask material 270 during a corresponding cleaning process.

FIG. 2i schematically illustrates the device 200 when exposed to an etch ambient 211 in order to selectively remove the material 261 from the gate electrode structure 260A, thereby forming a first gate opening 262. As previously explained, any selective etch recipes are available, for instance based on TMAH, which may be used during the etch process 211, wherein the mask layer 270 may provide the desired etch stop capabilities to avoid material loss in the gate electrode structure 260B. Furthermore, the cap material 264 may act as an efficient etch stop material during the process 211, as is also previously discussed. Consequently, after forming the gate opening 262, an appropriate electrode metal may be filled into the opening 262 in order to provide an appropriate work function adjusting species in combination with an appropriate electrode material.

FIG. 2j schematically illustrates the semiconductor device 200 during a deposition process or sequence 212 during which an electrode metal 266A may be filled into the opening 262, which may be accomplished on the basis of any appropriate deposition technique. It should be appreciated that the electrode metal 266A may comprise one or more sub-layers (not shown) in order to provide the work function adjusting species that is appropriate for the transistor 250A followed by the deposition of an electrode material, such as aluminum and the like, which may provide the desired high conductivity of the gate electrode structure 260A. In other cases, the work function adjusting species, for instance in the form of lanthanum and the like, may be provided within the material 266A so as to form a more or less continuous mixture, if considered appropriate. At any rate, in the process 212, superior deposition conditions may be achieved since other material layers, such as conductive barrier materials and the like, may not be required. Consequently, the work function of the material 266A in combination with the cap material 264 and the gate dielectric material 263 may be adjusted on the basis of superior device and process conditions compared to conventional approaches, as previously described with reference to the semiconductor device 100.

FIG. 2k schematically illustrates the device 200 during a material removal process 213 in which any excess portion of the material 266A (FIG. 2j) may be removed, which may be accomplished on the basis of CMP and the like. In the embodiment shown, the removal process 213 may be controlled so as to remove a portion of the interlayer dielectric material 220 together with the material 266A and the mask material 270 of the gate electrode structure 260B in order to expose the placeholder material 261. At the same time, a portion 266V of the electrode metal 266A in the gate electrode structure 260A may also be removed, thereby providing a superior overall cross-sectional configuration of the gate electrode structure 260A, in particular in densely packed device regions in which a plurality of gate electrode structures 260A may be provided with a reduced lateral spacing. Thus, by appropriately controlling the removal process 213, a desired degree of thickness reduction 220R may be accomplished in order to reliably expose the material 261. In this case, any additional masking regime for exposing the material 261 of the gate electrode structure 260B may be avoided.

FIG. 2l schematically illustrates the device 200 in a further advanced manufacturing stage in which the placeholder material 261 (FIG. 2k) may be exposed and may be removed in the gate electrode structure 260B on the basis of any appropriate selective etch process 214, for instance using TMAH and the like, in order to form a second gate opening 262B. On the other hand, the electrode metal 266A may act as an etch stop material or may at least have a significantly reduced etch rate compared to the material 261, thereby preserving a significant portion of the material 266A during the process 214. Consequently, the process 214 may not substantially affect the work function in the gate electrode structure 260A, while any material erosion in the metal 266A may be compensated for during the further processing when filling the gate opening 262B with a further electrode metal.

FIG. 2m schematically illustrates the semiconductor device 200 during a deposition process 215 in which the gate opening 262B may be filled with an appropriate electrode metal 266B, which may comprise any appropriate work function adjusting species, for instance in the form of a separate material layer (not shown) or in the form of a substantially uniform material and the like. Moreover, the material 266B may provide superior conductivity of the gate electrode structure 260B. As discussed above, during the deposition process 215, any material loss in the gate electrode structure 260A may also be efficiently compensated for, however, without affecting the work function in the gate electrode 260A, since at least a significant portion of the previous material 266A may be preserved, as discussed above.

FIG. 2n schematically illustrates the semiconductor device 200 during a further planarization process 216, such as a CMP process, in which any excess portion of the electrode metal 266b (FIG. 2m) may be removed. Consequently, during the process 216, the gate electrode structures 260A, 260B may be provided as electrically isolated structures, wherein a certain degree of over-polish may result in a reliable removal of any metal residues from the interlayer dielectric material 220. In other cases, the removal process 216 may comprise additional etch processes, cleaning processes and the like as may be required for reliably removing any metal residues from the dielectric material 220. Moreover, if required, any processes for adjusting and/or stabilizing the characteristics of the gate electrode structures 260A, 260B may be applied, for instance by diffusing a work function adjusting species towards the dielectric material 263 and the like. Consequently, at least in or in the vicinity of the dielectric material 263 and the cap layer 264, a work function adjusting species 267A may be provided in the gate electrode structure 260A and similarly a work function adjusting species 267B may be provided in the gate electrode structure 260B. Hence, the characteristics of the transistors 250A, 250B in the form of the threshold voltage may be adjusted in a highly reliable manner on the basis of a replacement gate approach, while any lithography processes and patterning regimes for incorporating work function adjusting metal species in the presence of sophisticated gate openings may be avoided.

With reference to FIGS. 2o-2r, further illustrative embodiments will now be described in which a difference in gate height may be advantageously used to provide a mask material in one gate electrode structure when removing the placeholder material in the other gate electrode structure. As previously discussed, upon incorporating an embedded strain-inducing semiconductor alloy in an early manufacturing stage, a certain degree of gate height mismatch may be introduced, which may be used for providing an efficient mask material. In further illustrative embodiments, additionally or alternatively to this difference in gate height, an intentionally generated difference in topography may be implemented during the patterning sequence for forming the gate electrode structures, as is described with reference to FIGS. 2o and 2p.

FIG. 2o schematically illustrates the semiconductor device 200 in a manufacturing stage in which the gate layer stack 260S may comprise the dielectric material 263, the cap material 264 and the placeholder material 261. Moreover, a buffer layer 268, for instance in the form of a silicon nitride material, may be provided in the gate layer stack 260S and may have an appropriate thickness so as to introduce a desired difference in gate height or increase a corresponding difference in gate height which may be introduced upon providing a strain-inducing semiconductor alloy in the active region 203B. For example, a thickness of the buffer layer 268 may be 10 nm or less.

With respect to a deposition technique for forming the buffer layer 268, any appropriate process recipe may be applied, such as plasma enhanced CVD, thermally activated CVD and the like. After the deposition of the buffer layer 268, an etch mask 216, such as a resist mask, may be formed so as to cover the layer 268 above the active region 203A in order to produce an increased gate height above the active region 203A upon the further processing. Moreover, the device 200 may be exposed to an etch process, such as hot phosphoric acid and the like, in which an exposed portion of the buffer layer 268 may be removed.

FIG. 2p schematically illustrates the device 200 in a further advanced manufacturing stage in which the gate layer stack 260S may comprise the cap material 264, which may thus result, in combination with the buffer material 268, in an increased height of the gate layer stack 260S above the active region 203A. Moreover, the hard mask material 267 may be formed above the layer stack 260S and may have any appropriate configuration, as is also previously described.

It should be appreciated that the further processing may be continued by patterning the layer stack 260S, as is also discussed above, followed by further processes for forming the transistor elements. In some illustrative embodiments, a strain-inducing semiconductor material may be embedded in the active region 203B, which may result in a significant material loss of the cap material 264 above the active region 203B, i.e., the corresponding gate electrode structure formed thereon, which may thus even further enhance the resulting difference in the gate height. In other illustrative embodiments, transistor elements may be formed without incorporating a strain-inducing semiconductor material in the active region 203B.

FIG. 2q schematically illustrates the semiconductor device 200 in a further advanced manufacturing stage. As illustrated, the transistors 250A, 250B may comprise the gate electrode structures 260A, 260B having the gate height 268A, 268B, respectively. As explained above, the difference in the gate height may be introduced by incorporating the strain-inducing material 256 in the transistor 250B and/or by providing the buffer layer 268 selectively in the gate electrode structure 260A. In the embodiment shown in FIG. 2q, both mechanisms have been implemented, i.e., the incorporation of the material 256 and the provision of the buffer layer 268. In this case, superior process margins may be achieved with respect to appropriately masking the gate electrode structure 260B during the further processing.

Moreover, as illustrated, the interlayer dielectric material 220 may have been planarized, as previously explained, wherein a corresponding removal process, such as a CMP process, may be stopped upon exposing the material 221 above the gate electrode structure 260A, thereby preserving a certain portion 222B of the material layer 222 above the gate electrode structure 260B. That is, due to the pronounced difference in gate height, the material 221 above the gate electrode structure 260A may be reliably exposed, while nevertheless preserving the portion 222B, which may thus act as an etch stop material during the further processing.

FIG. 2r schematically illustrates the semiconductor device 200 in a further advanced manufacturing stage in which the placeholder material 261 in the gate electrode structure 260A may be exposed, which may be accomplished on the basis of any appropriate etch process, such as a plasma assisted etch process, a wet chemical etch process, as is also previously described. During the corresponding etch process, the dielectric material 222 may act as an etch stop material wherein, in particular, the portion 222B may preserve the material 221 above the gate electrode structure 260B. Consequently, integrity of the material 261 in the gate electrode structure 260B may be preserved with superior efficiency, while also any further aggressive processes, such as cleaning processes on the basis of hydrofluoric acid and the like, may be efficiently applied due to the superior etch resistivity of the materials 221 and 267R.

Thereafter, the further processing may be continued by removing the material 261 in the gate electrode structure 260A and filling the resulting gate opening with an appropriate electrode metal, as previously described. Thereafter, upon removing any excess material, also the remaining portion 222B and the materials 221 and 267R may be removed from above the gate electrode structure 260B, thereby exposing the placeholder material 261 thereof. Next, the further processing may be continued, as is also described above.

As a result, the present disclosure provides semiconductor devices and manufacturing techniques in which a replacement gate approach may be applied by separately removing a placeholder material and filling the resulting gate opening of one type of gate electrode structure prior to removing the placeholder material of another type of gate electrode structure. For this purpose, a mask material or a difference in gate height may be introduced in an early manufacturing stage so that an efficient masking regime may be applied upon selectively removing the placeholder materials of the different types of gate electrode structures. Consequently, the work function adjusting species and appropriate electrode metals may be provided individually for each type of gate electrode structure so that the resulting gate electrode structures may have superior characteristics in terms of threshold voltage stability and the like. For example, in some devices, the gate electrode structures of one type may comprise the appropriate work function adjusting species for this type of gate electrode structure while substantially completely lacking the work function adjusting species that is used for the other type of gate electrode structure. Similarly, the other type of gate electrode structure may substantially lack any work function adjusting species of the former type of gate electrode structure.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   removing a placeholder material from a first gate electrode structure of a first transistor so as to form a first gate opening while masking said placeholder material in a second gate electrode structure of a second transistor, wherein masking said placeholder material of said second gate electrode structure comprises providing an etch stop material selectively above said placeholder material above an active region of said second transistor prior to forming said first and second gate electrode structures;
   filling said first gate opening with a first electrode material;
   removing said placeholder material of said second gate electrode structure in the presence of said first electrode material so as to form a second gate opening; and
   filling said second gate opening with a second electrode material.

2. The method of claim 1, wherein filling said first gate opening comprises depositing said first electrode material and removing an excess portion of said first electrode material by applying at least a polishing process.

3. The method of claim 2, wherein removing an excess portion of said first electrode material comprises exposing a top surface of said placeholder material of said second gate electrode structure.

4. The method of claim 1, wherein said etch stop material is provided with a thickness of 10 nm or less.

5. The method of claim 1, wherein removing said placeholder material of said first gate electrode structure comprises planarizing an interlayer dielectric material that encloses said first and second gate electrode structures and performing an etch process so as to selectively expose said placeholder material of said first gate electrode structure.

6. The method of claim 5, wherein planarizing said interlayer dielectric material comprises removing a first sub-layer of said interlayer dielectric material above said first gate electrode structure so as to expose a second sub-layer while preserving a portion of said first sub-layer above said second gate electrode structure.

7. A method, comprising:
removing a placeholder material from a first gate electrode structure of a first transistor so as to form a first gate opening while masking said placeholder material in a second gate electrode structure of a second transistor, comprising:
planarizing an interlayer dielectric material that encloses said first and second gate electrode structures and performing an etch process so as to selectively expose said placeholder material of said first gate electrode structure, wherein planarizing said interlayer dielectric material comprises removing a first sub-layer of said interlayer dielectric material above said first gate electrode structure so as to expose a second sub-layer while preserving a portion of said first sub-layer above said second gate electrode structure; and
using said preserved portion of said first sub-layer as an etch mask when performing said etch process to selectively remove said placeholder material of said first gate electrode structure;
filling said first gate opening with a first electrode material;
removing said placeholder material of said second gate electrode structure in the presence of said first electrode material so as to form a second gate opening; and
filling said second gate opening with a second electrode material.

8. The method of claim 5, wherein performing said etch process comprises stopping said etch process on an etch stop material that is to be used for masking said placeholder material of said second gate electrode structure when removing said placeholder material of said first gate electrode structure.

9. The method of claim 6, further comprising forming a strain-inducing semiconductor alloy in said second transistor prior to forming said first and second gate openings.

* * * * *